US005130656A

United States Patent [19]

Requardt et al.

[11] Patent Number: 5,130,656
[45] Date of Patent: Jul. 14, 1992

[54] SURFACE COIL FOR A NUCLEAR MAGNETIC RESONANCE APPARATUS

[75] Inventors: Hermann Requardt, Erlangen; Norbert Krause, Heroldsbach, both of Fed. Rep. of Germany

[73] Assignee: Siemens Aktiengesellschaft, Berlin and Munich, Fed. Rep. of Germany

[21] Appl. No.: 513,855

[22] Filed: Apr. 24, 1990

[30] Foreign Application Priority Data

Apr. 24, 1989 [EP] European Pat. Off. ........ 89107387.6

[51] Int. Cl.$^5$ .......................... G01R 33/20; A61B 5/05
[52] U.S. Cl. ................................. 324/318; 128/653.1
[58] Field of Search ............... 324/318, 322, 307, 309; 128/653 SC

[56] References Cited

U.S. PATENT DOCUMENTS

| 4,717,881 | 1/1988 | Flugan | 324/322 |
| 4,793,356 | 12/1988 | Misic et al. | 128/653 |
| 4,897,604 | 1/1990 | Carlson et al. | 324/318 |
| 4,924,868 | 5/1990 | Krause et al. | 324/318 |
| 4,973,907 | 11/1990 | Bergman et al. | 324/318 |
| 4,975,644 | 12/1990 | Fox | 324/318 |

FOREIGN PATENT DOCUMENTS

| 0175129 | 8/1985 | European Pat. Off. |
| 0280908 | 2/1988 | European Pat. Off. |
| WO8400214 | 1/1984 | PCT Int'l Appl. |
| 2159626 | 2/1985 | United Kingdom |

Primary Examiner—Hezron E. Williams
Assistant Examiner—Louis M. Arana
Attorney, Agent, or Firm—Hill, Van Santen, Steadman & Simpson

[57] ABSTRACT

A surface coil for a nuclear magnetic resonance apparatus has a number of conductor sections arranged relative to each other. These sections can be connected to one another and to a reception unit by employing switches to enclose a preferable conductor geometry to obtain a localized image. The outer contour formed by the conductor sections is geometrically configured such that the width of the surface coil changes over its length. Thus, the coil can be positioned to conform to both an area and position which allow every segment of the localized area of interest of the examination subject to be examined with optimal signal-to-noise ratio. Further, a transmission coil which encompasses the conductor section is capable of transmitting localized radiofrequency signals, thus, eliminating the need for the use of a whole-body resonator for imaging localized areas of interest.

15 Claims, 4 Drawing Sheets

SURFACE COIL FOR A NUCLEAR MAGNETIC RESONANCE APPARATUS

BACKGROUND OF THE INVENTION

1. Field of the Invention

The present invention relates to an adjustable surface coil of the type suitable for obtaining nuclear magnetic resonance signals from an examination subject in a nuclear magnetic resonance examination apparatus.

2. Description of Prior Art

Nuclear magnetic resonance examination devices may use surface coils to obtain localized images of an examination subject. Surface coils can generate both fundamental and gradient magnetic fields applicable to the examination subject. The subject is irradiated via an antenna with a sequence of radio frequency pulses, resulting in the emission of nuclear magnetic resonance signals, which are acquired by a surface coil, and transmitted to an evaluation unit through a tuning circuit. Such a surface coil is disclosed, for example, in published patent application WO 84/00214.

Surface coils are used in nuclear magnetic resonance tomography, as well as nuclear magnetic resonance spectroscopy, when localized images require an improved image contrast. Such contrast can be attained by improving the signal-to-noise ratio of the emitted signals from the examination subject. For example, in spinal column diagnosis, a compromise must be made using conventional surface coils. Large (oval) surface coils will allow for a large measuring field to be examined with a high penetration depth. The signal-to-noise ratio for such a large field, however, is poor. For small (generally round) surface coils, the signal-to-noise ratio is favorable, however, only a small measuring field and a slight penetration depth can be attained.

A surface coil having numerous conductor sections arranged relative to each other, with switches connecting the conducting sections in different combinations, permits the use of a single surface coil to be used in the examination of different localized regions without physically displacing the coil. In such a coil, which is disclosed in European Application 0 280 908, the different combinations of conductor sections, when connected, may form a rectangle which is adjacent to, or overlaps, a rectangle of unconnected sections. This method of examination, however, does not result in a surface coil configuration in alignment with the geometry of the spine. As a result, an improved image contrast is still desired for localized examinations of this type.

SUMMARY OF THE INVENTION

It is an object of the present invention to further improve the initially recited surface coil by developing a configuration which optimizes the signal-to-noise ratio for localized examinations.

The above object is achieved by improvements to the geometric and mechanical configurations of the surface coil, whereby the width of the coil may be adjusted to vary with the length of coil for appropriate geometric configurations. By allowing for adjustable spacing of the surface coil, in better correlation with the variable depth of a localized region of interest in vivo, the optimal signal-to-noise ratio can be achieved.

Thus, the structure disclosed in this application permits an improved signal-to-noise ratio with regard to localized regions of interest having a variable transverse depth of penetration.

DESCRIPTION OF THE PREFERRED EMBODIMENTS

Figure 1:
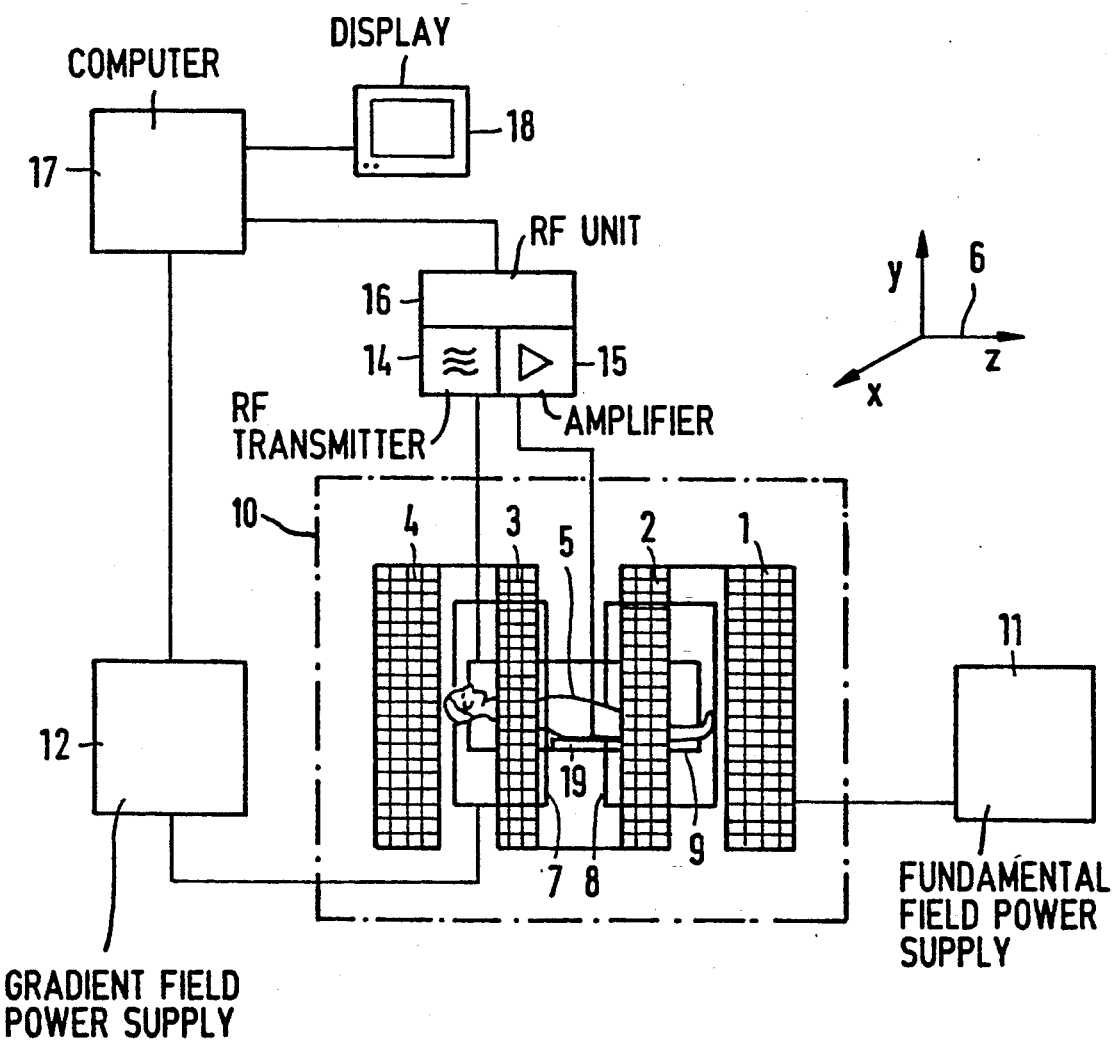
FIG. 1 is a schematic view of a nuclear magnetic resonance apparatus of the type in which the surface coil of the present invention may be used.

The basic components of a nuclear magnetic resonance apparatus, of the type in which the surface coil disclosed and claimed herein may be used, are shown in FIG. 1. The apparatus includes coils 1, 2, 3 and 4 for generating a fundamental magnetic field in which, for medical uses, a patient 5 to be examined is disposed. The patient 5 is also disposed within gradient fields respectively generated by a plurality of gradient coils. These gradient fields are orthogonal, as demonstrated by the representative orientations in the coordinate system 6. Only the gradient coils 7 and 8 are shown in FIG. 1 for the purpose of clarity. The gradient coils 7 and 8 generate a gradient field in the x-direction in combination with a pair of identical gradient coils disposed oppositely thereto. Similar sets of gradient coils (not shown) for generating a gradient field in the y-direction are disposed parallel to, as well as above and below, the patient 5. Gradient coils for generating a gradient field in the z-direction are disposed transversely relative to the longitudinal axis of the patient 5, at the patient's feet and head.

The apparatus also includes a body resonator 9 functioning as an antenna for inducing the nuclear magnetic resonance signals in the patient 5. A surface coil 19 (described in greater detail below) acquires the resulting nuclear magnetic resonance signals. The surface coil 19 may alternatively serve the dual purpose of generating the nuclear magnetic resonance signals, instead of using the body resonator 9.

The actual examination instrument in which the patient 5 is disposed is bound by the dot-dashed lines 10. A power supply 11 is provided for operating the fundamental field coils 1 through 4, and the gradient coils are supplied by a power supply 12. A radio-frequency transmitter 14, controlled by a process computer 17, is connected to the body resonator 9. The surface coil 19 is also connected to the process computer 17 via a signal amplifier 15. A display 18 is connected to the output of the computer 17 for visual representation of an image of the localized region. The transmitter 14 and the signal amplifier 15 are part of a radio-frequency unit 16 for signal generation and registration.

Figure 2:
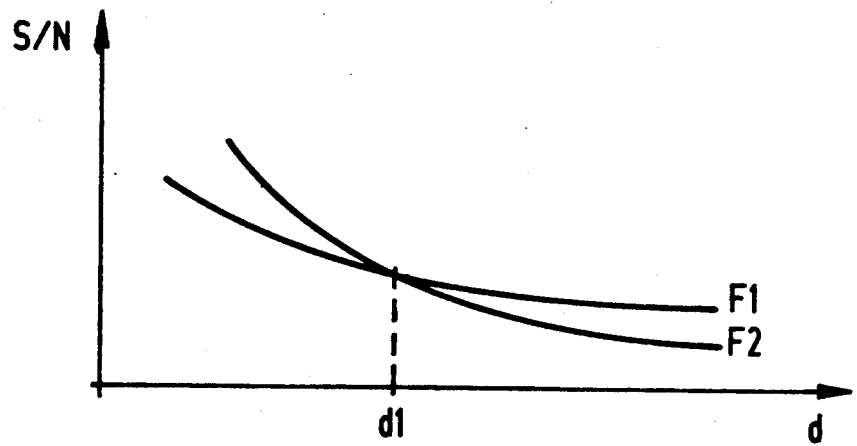
FIG. 2 is a graphical representation of the dependence of the image contrast (due to the signal-to-noise ratio) on the penetration depth of a localized region of interest for two surface coils of different dimensions.

Further details concerning the dependance of the signal-to-noise ratio, with respect to the depth of the local region of interest, are shown graphically in FIG. 2. $F_1$ represents a large surface coil which has a higher signal-to-noise ratio for $d>d_1$. $F_2$ represents a small surface coil, which has a higher signal-to-noise ratio for $d<d_1$. Thus, the optimum dimension of the surf coil, which will achieve the highest signal-to-noise ratio, depends on the depth of the local area of interest in vivo.

Figure 3:
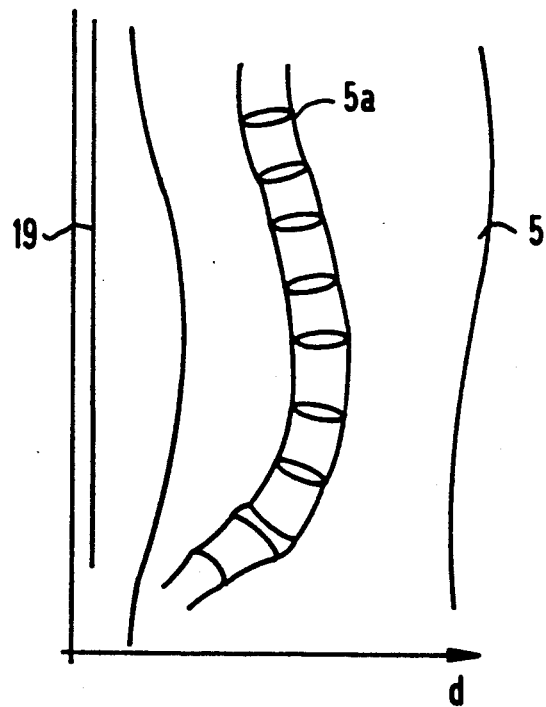
FIG. 3 is a schematic plan view of the spinal column in relation to the planar surface of the present invention.

An example of a local area of interest in vivo which requires an improved image contrast is the spinal column. FIG. 3 is a schematic representation of the course of the spinal column 5a of a patient 5 over the surface coil 19. The depth of the spine in vivo is referenced d. The "region of interest" is the spinal column 5a, which is not geometrically aligned with the surface coil 19.

In accordance with the principles of the invention, the depth profile of the surface coil 19 should be adaptable to the respective depth of the spinal column 5a, so that every segment of the spinal column can be imaged with an optimal signal-to-noise ratio. This can be achieved by a combination of geometric and mechanical considerations.

Figure 4:
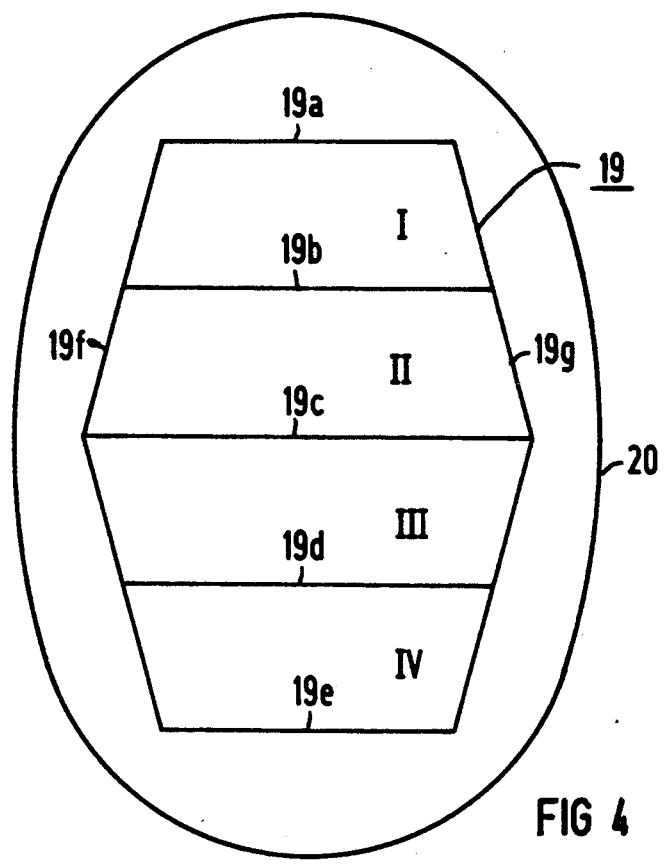
FIG. 4 is a schematic plan view of a first embodiment of a surface coil constructed in accordance with the principles of the present invention.

FIG. 4 shows the first exemplary embodiment of the surface coil 19. The outer contour of the surface coil 19 corresponds to that of a lozenge flattened at 19a and 19e. A plurality of transverse conductors 19a-19e, parallel to one another, are arranged between the outside conductors 19f, 19g, that form the outer contour of the surface coil 19. Four elements I-IV are formed by the outside conductors 19f, 19g and by the transverse conductors 19a-19e, whereby the two outer elements of I and IV are smaller than the two inner surface elements II and III.

The arrangement of the surface coil 19 with respect to the patient 5 insures that the surface coil in regions I and IV is closer to the spinal column than the surface coil in regions II and III. Thus, the depth profile of the surface coil 19 is adapted to the alignment of the spinal column, such that every segment of the spinal column is imaged with a maximum signal-to-noise ratio.

The surface coil 19 is surrounded by a transmission coil 20, which can transmit radio-frequency pulses to the patient 5, such that employment of a whole-body resonator is unnecessary. The radio-frequency stress on the patient is thus limited to the localized region of interest, and overall radio-frequency stress is reduced.

Figure 5:
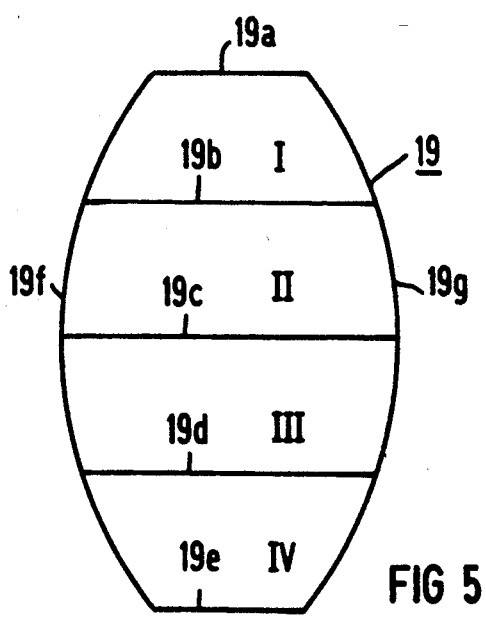
FIG. 5 is a schematic plan view of a second embodiment of a surface coil constructed in accordance with the principles of the present invention.

FIG. 5 shows the second exemplary embodiment of the surface coil 19. The outer contour of the surface coil 19 corresponds to that of an oval flattened at 19a and 19e. A plurality of transverse conductors 19a-19e, parallel to one another, again form the four surface elements I-IV between the outside conductors 19f, 19g. The depth profile of this surface coil 19 is also adapted to the course of the spinal column.

Figure 6:
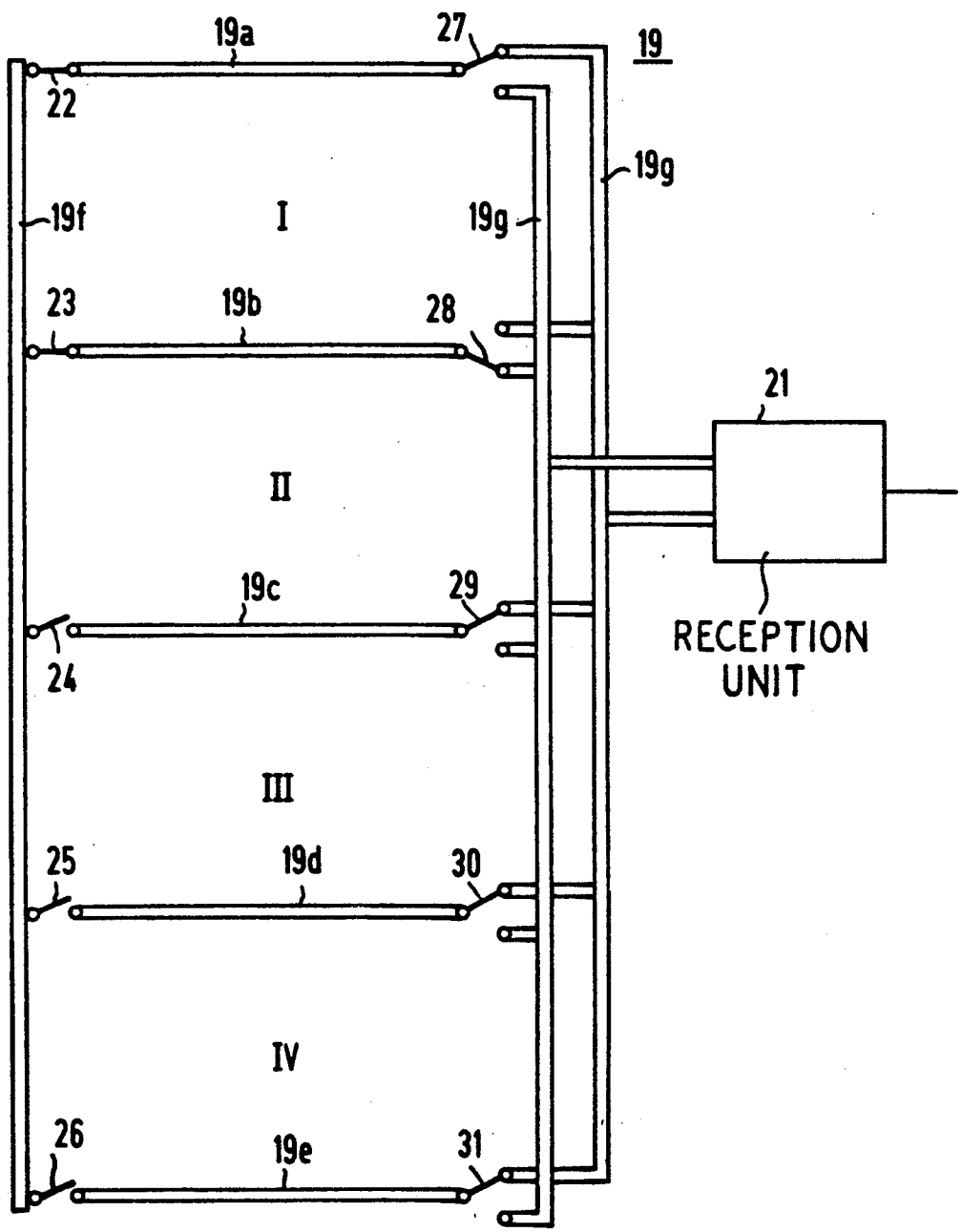
FIG. 6 is a schematic plan view of an embodiment of the arrangement of switches within the surface coil constructed in accordance with the principles of the present invention.

Concerning both FIGS. 4 and 5, the switches necessary for activation of sections I-IV of the surface coil 19, as well as the coupling to the reception unit, are discussed in conjunction with FIG. 6.

The circuitry of the surface coil is shown in FIG. 6. In FIG. 6, the outer conductors will have a shape as shown in FIGS. 4 or 5, however, since the shape does not alter the electrical switching states, FIG. 6 has been shown in a generic form. One end of each of the transverse conductors 19a-19c is connected by a respective switch 22-26 to the part 19f of the outside conductor. The other end of each transverse conductor 19a-19e is optionally connected via a switch-over means 27-31 to a part 19g or 19g' of the outside conductor 19f, 19g. The part 19g is connected to a reception unit 21 at a first terminal and the part 19g' is connected to the reception unit 21 at a second terminal. This configuration allows successive sections of the surface coil 19 to be connected to the reception unit 21, depending on the position of switches 22-31. Thus, one or more of the surface elements I-IV that have a different size can be activated in the exemplary embodiment.

For example, when switches 22 and 23 are closed, switch 27 is connected to the outside conductor 19g', and switch 28 is connected to the outside conductor 19g, then Section I of the surface coil 19 is connected to the reception unit 21, where conductor 19a is connected to the second terminal of the reception unit 21 via 19g' and conductor 19b is connected to the first terminal of the reception unit 21 via 19g. With a corresponding drive of the switches 22-31, the Sections I-IV can be successively connected to the reception unit 21 and thus, the spinal column can thus be imaged without moving the patient or the surface coil. The depth of penetration is thus optimized such that the spinal column is imaged with a maximum signal-to-noise ratio. When the transmission coil of FIG. 4 is employed as a transmission antenna, then a radio-frequency stress is applied only in the "region of interest."

Small sections of the surface coil have been pawled, thus maintaining a low sensitivity of the output signal. Artifact from respiratory motion is thus greatly suppressed.

We claim as our invention:

1. In nuclear magnetic resonance apparatus for examining a patient having means for generating a fundamental magnetic field and means for generating a plurality of gradient fields in which said patient is disposed, and means for inducing nuclear magnetic resonance signals in said patient, a surface coil connected to a tuning circuit for detecting and transmitting said nuclear magnetic resonance signals, said surface coil comprising:

a plurality of conductor sections arranged relative to each other and adapted for circumscribing different areas, regions and geometries of a patient in a plurality of respective combinations, said surface coil having variable widths so that said combinations geometrically conform to a local region of interest; and switching means for selectively electrically connecting different groups of said plurality of conductor sections together so that said different areas and different regions of said patient can be examined without physical displacement of said conductor sections to form said combinations, said switching means adapted to electrically connect a combination so formed to said tuning circuit.

2. A surface coil as claimed in claim 1, wherein the width of the area covered by the surface coil decreases symmetrically from the center thereof.

3. A surface coil as claimed in claim 2, wherein said surface coil comprises outside connectors which are curved substantially in the form of a portion of an oval, and between which a plurality of transverse conductors are arranged parallel to each other, said switching means being operable to connect the transverse to the outside conductors to form said combinations.

4. A surface coil as claimed in claim 2, wherein said surface coil comprises outside conductors which are curved substantially in the form of a portion of a trapezoid, and between which a plurality of transverse conductors are arranged parallel to each other, said switching means being operable to connect the transverse conductors to the outside conductors to form said combinations.

5. A surface coil as claimed in claim 1 further comprising a transmission coil surrounding the entire area of the plurality of conductor sections.

6. In a nuclear magnetic resonance apparatus for examining a patient having means for generating a fundamental magnetic field and means for generating a plurality of gradient fields in which said patient is disposed, and means for inducing nuclear magnetic resonance signals in said patient, a surface coil connected to a tuning circuit for detecting and transmitting said nuclear magnetic resonance signals, said surface coil comprising:

a plurality of conductor section arranged relative to each other and adapted for circumscribing different areas, regions and geometries of a patient and a plurality of respective combination, said surface coil having variable widths so that said combinations provide the proper configuration for obtaining an optimal signal-to-noise ratio for various penetration depths within a region of interest; and switching means for selectively electrically connecting different groups of said plurality of conductor sections together so that said different areas and different regions of said patient can be examined without physical displacement of said conductor sections to form said combinations, said switching means adapted to electrically connect a combination so formed to said tuning circuit.

7. A nuclear magnetic resonance apparatus for examining a patient having means for generating a fundamental magnetic field and means for generating a plurality of gradient fields in which said patient is disposed, and means for inducting nuclear magnetic resonance signals in said patient, a surface coil connected to a tuning circuit for detecting and transmitting said nuclear magnetic resonance signals, said surface coil comprising:

a plurality of conductor sections arranged relative to each other and adapted for circumscribing different areas, regions and geometries of a patient and a plurality of respective combinations having outer conductors which are mirror symmetric and nonparallel, connected by a plurality of transverse conductors; and switching means for selectively electrically connecting different groups of said plurality of conductor sections together so that said different areas in different regions of said patient can be examined without physical displacement of said conductor sections to form said combinations, said switching means adapted to electrically connect a combination so formed to said tuning circuit.

8. A surface coil as claimed in claim 6, wherein the width of the area covered by the surface coil decreases symmetrically from a center of the surface coil.

9. A surface coil as claimed in claim 8 wherein said surface coil comprises outside conductors which are curved substantially in the form of a portion of an oval, and between which a plurality of transverse conductors are arranged parallel to each other, said switching means being operable to connect the transverse conductors to the outside conductors to form said combinations.

10. A surface coil as claimed in claim 8, wherein said surface coil comprises outside conductors which are curved substantially in the form of a portion of a trapezoid, and between which a plurality of transverse conductors are arranged parallel to each other, said switching means being operable to connect the transverse conductors to the outside conductors to form said combinations.

11. A surface coil as claimed in claim 6 further comprising a transmission coil surrounding the entire area of the plurality of conductor sections.

12. A surface coil as claimed in claim 7, wherein the width of the area covered by the surface coil decreases symmetrically from the center thereof.

13. A surface coil as claimed in claim 12, wherein said surface coil comprises outside conductors which are curves substantially in a portion of an oval, and between which a plurality of transverse conductors are arranged parallel to each other, said switching means being operable to connected the transverse conductors to the outside conductors to form said combinations.

14. A surface coil as claimed in claim 12, wherein said surface coil comprises outside conductors which are curves substantially in the form of a portion of a trapezoid, and between which a plurality of transverse conductors are arranged parallel to each other, said switching means being operable to connect the transverse conductors to the outside conductors to form said combinations.

15. A surface coil as claimed in claim 7 further comprising a transmission coil surrounding the entire area of the plurality of conductor sections.

* * * * *